(12) United States Patent
Sridhara et al.

(10) Patent No.: US 9,236,096 B2
(45) Date of Patent: Jan. 12, 2016

(54) INITIALIZING DUMMY BITS OF AN SRAM TRACKING CIRCUIT

(75) Inventors: Srinivasa Raghavan Sridhara, Plano, TX (US); Raviprakash Suryanarayana Rao, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/611,796

(22) Filed: Sep. 12, 2012

(65) Prior Publication Data
US 2014/0071735 A1   Mar. 13, 2014

(51) Int. Cl.
| G11C 11/00 | (2006.01) |
| G11C 7/08 | (2006.01) |
| G11C 7/22 | (2006.01) |
| G11C 29/50 | (2006.01) |
| G11C 11/41 | (2006.01) |

(52) U.S. Cl.
CPC  *G11C 7/08* (2013.01); *G11C 7/227* (2013.01); *G11C 29/50012* (2013.01); *G11C 11/41* (2013.01)

(58) Field of Classification Search
USPC .......................................................... 365/154
See application file for complete search history.

(56) References Cited

U.S. PATENT DOCUMENTS

| 5,223,573 | A  * | 6/1993 | Kuruganti et al. ............... 525/67 |
| 2004/0085800 | A1* | 5/2004 | Ogawa et al. .................. 365/145 |
| 2006/0050590 | A1* | 3/2006 | Nautiyal et al. ............... 365/226 |

* cited by examiner

*Primary Examiner* — Anthan Tran
(74) *Attorney, Agent, or Firm* — John R. Pessetto; Frank D. Cimino

(57) ABSTRACT

An embodiment of the invention discloses a method for writing concurrently a binary logical value to one or more dummy memory cells in a dummy bit line pair. A diode is electrically connected between a power supply and the positive power supply line connected to the dummy memory cells. The binary logical value is then driven on to the dummy bit line pair. Next, one or more dummy word lines are driven to a logical high allowing selected dummy memory cells to be written with the binary logical value. After the selected dummy memory cells have been written to, the one or more dummy word lines are driven to a logical low. Next the diode is disabled by turning on a PFET connected between the power supply and the positive power supply line. Turning on the PFET also electrically connects the power supply to the positive power supply line.

16 Claims, 5 Drawing Sheets

INITIALIZING DUMMY BITS OF AN SRAM TRACKING CIRCUIT

BACKGROUND

This invention relates to integrated circuits, particularly to static random access memory (SRAM) devices, in either embedded form or stand alone (i.e. discrete) form.

Memory cells in SRAM devices store logical binary values (i.e. either a logical one or a logical zero). When a memory cell is selected by a word line during a read, the voltage on a latch in the memory cell begins to change the voltages on the bit lines attached to the memory cell (i.e. signal is developing on the bit lines). Because the signal on the bit lines is initially small, a certain amount of time must pass to allow the signal on the bit lines to grow larger. When the signal on the bit lines reaches a certain value, this value may be sensed by a sense amp. The sense amp increases the voltage found on the bit lines so that the signal may be transferred to another part of the SRAM.

When data is read from an SRAM memory cell and the time allowed for the signal on the bit lines to increase is too short, the sense amp may fail to amplify the correct logical value and an error occurs in the SRAM. When data is read from an SRAM memory cell and the time allowed for the signal on the bit lines to increase is too long, the sense amp properly amplifies the correct logical value. However, because the time allowed was long, the read access time of the SRAM increases. In order to keep the read access time as short as possible and read correct data, it is important to be able vary the amount of time allowed for the signal on the bit lines to develop. Further, it is important to test SRAMs to ensure the availability of sufficient read margin by varying the amount of time allowed for a signal to develop on the bit lines during a read of an SRAM memory cell.

DETAILED DESCRIPTION

The drawings and description, in general, disclose a method and an electrical device for writing a binary logical value concurrently to a plurality of dummy memory cells electrically connected to a pair of dummy bit lines. In an embodiment of the invention, a diode and a PFET (p-type field-effect transistor) are electrically connected in parallel between a power supply and a positive power supply line. The positive power supply is electrically connected to all of the dummy memory cells electrically connected to the pair of dummy bit lines.

When the plurality of dummy memory cells are concurrently written to, the gate of the PFET is driven to a logical high value, turning off the PFET. Because the PFET is turned off, current is conducted through the diode resulting in a voltage drop between the power supply and the positive power supply line. After dropping the voltage on the positive power supply line, the first dummy bit line of the pair dummy bit lines is driven to a binary logical value while the second dummy bit line of the pair of dummy bit lines is driven to the opposite binary logical value of the value driven on the first dummy bit line. Each dummy memory cell has a separate and distinct dummy word line electrically connected to it. In order to write the binary logical value to each dummy memory cell, each dummy word line is driven to a logical high value concurrently.

Figure 1:
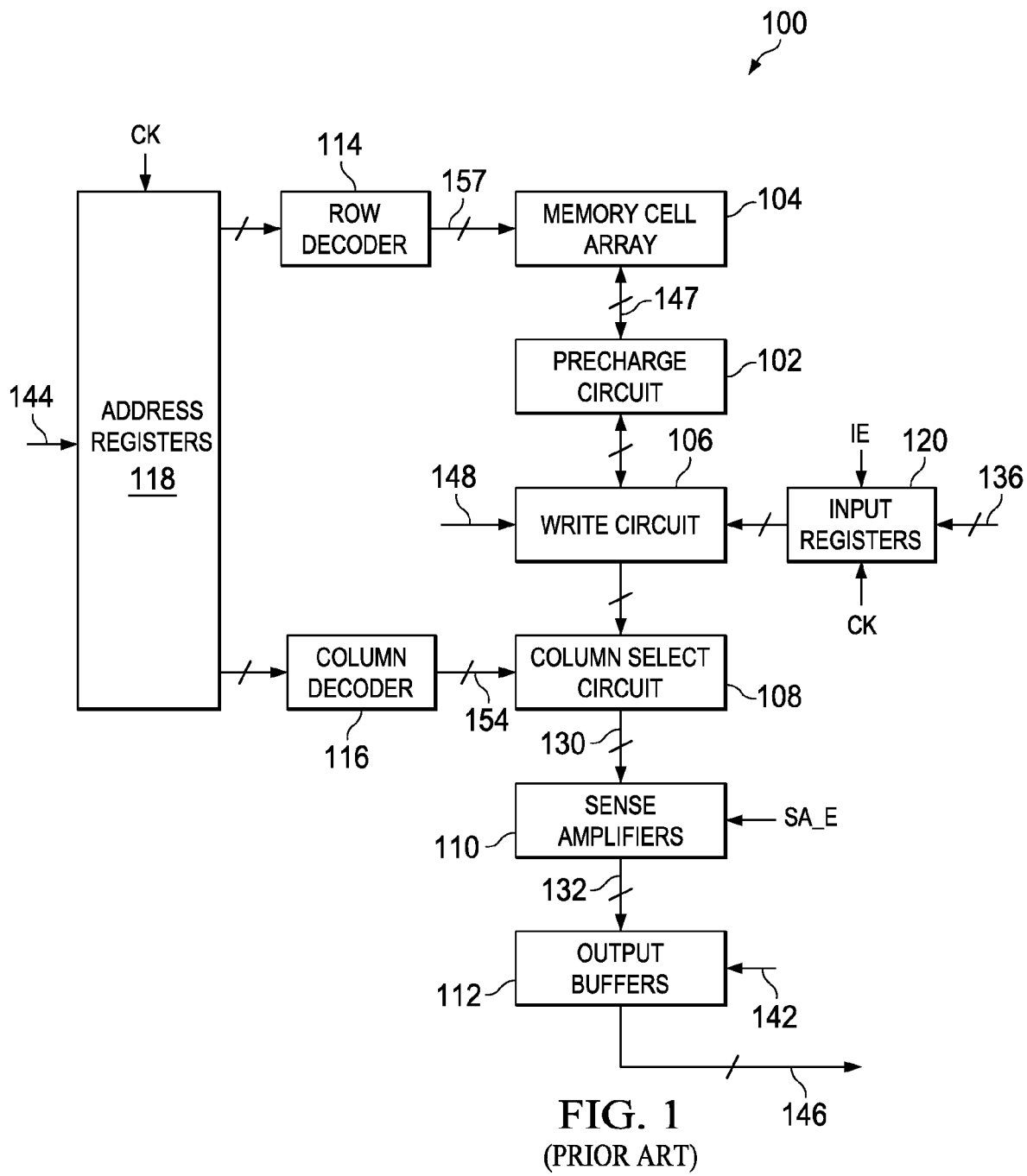
FIG. 1 is a block diagram of an SRAM (Static Random Access Memory). (Prior Art)

FIG. 1 is a block diagram of an SRAM (Static Random Access Memory) 100 (Prior Art). In this embodiment only a single array of SRAM cells 104 is shown for illustrative purposes. Typically, an SRAM has more than one array of SRAM cells. In this example, a pre-charge circuit 102 pre-charges the bit lines 147 in the memory cell array 104 to a predetermined voltage before the memory cell array 104 is either read from or written to.

When the memory cell array 104 is read from, an address 144 is input to the address registers 118. The address 144 stored in the address registers 118 is then clocked by a clock signal CK from the address registers to a row decoder 114 and a column decoder 116. In this example, the row decoder 114 drives a word line 157 in the memory cell array 104 to a logical high value. Memory cells attached to the selected word line provide data that is passed through the pre-charge circuit 102 and the write circuit 106 to the column select circuit 108. The column select circuit 108 selects what data 130 is provided to the sense amplifiers 110 based on the output 154 of the column decoder 116. The sense amplifiers 110 increase the voltage of the selected data 130 when the sense amplifiers are enabled by signal SAE. The amplified signals 132 are sent to the output buffers 112. The output buffers 112 retain the amplified signals 132. When the output enable signal 142 is active, the output buffers 112 send the stored data 146 in the output buffers 112 from the SRAM 100 to other circuits.

When the memory cell array 104 is written to, an address 144 is input to the address registers 118 and the write enable signal 148 is activated. The address 144 stored in the address registers 118 is then clocked by a clock signal CK from the address registers to a row decoder 114 and a column decoder 116. In this example, the row decoder 114 drives a word line 157 in the memory cell array 104 to a logical high value. The selected word line 157 along with the selected bit lines determine which memory cells in the memory cell array 104 will be written to. The input enable signal IE allows data 136 previously stored in the input registers 120 to be written into the memory cell array 104.

Figure 2:
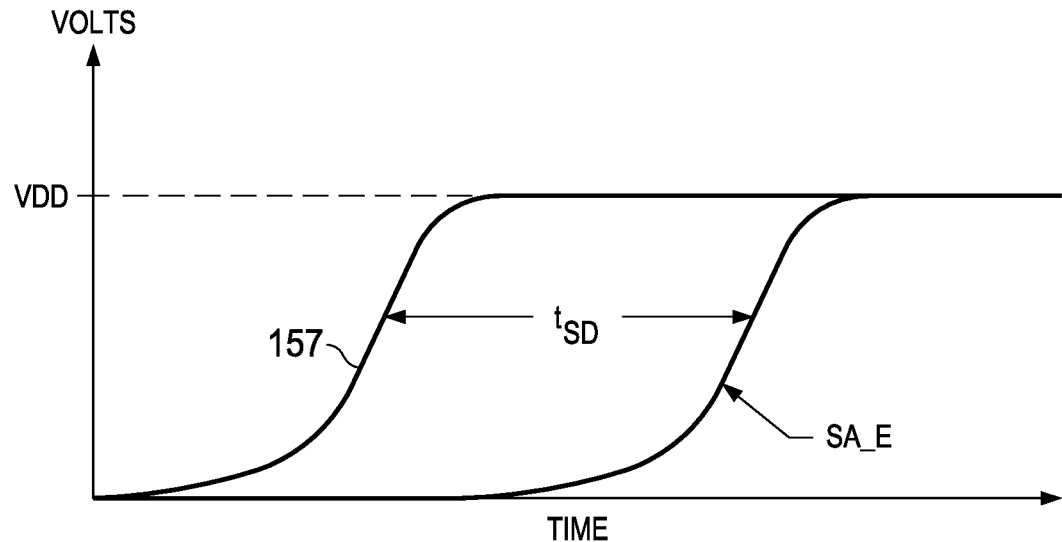
FIG. 2 is a timing diagram illustrating signal development time. (Prior Art)
Figure 3:
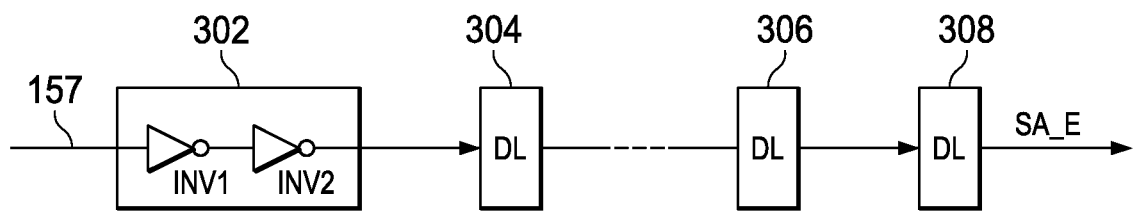
FIG. 3 is a block diagram of signal delay circuit. (Prior Art)

FIG. 2 is a timing diagram illustrating signal development time. The signal develop time $t_{sd}$ in this example is equal to the time measured from when the word line 157 is approximately 0.5*VDD to the time when the sense amp enable signal SA_E is approximately 0.5*VDD. The signal develop time may be implemented using delay blocks as shown in FIG. 3. In this example of signal delay circuit, the word line signal 157 is input to a delay block 302. Delay block 302 in this example consists of two inverters INV1 and INV2 in series. However, other types of circuits may be used to implement a delay block. The output of delay block 302 is input to delay block 304. The output of delay block 304 is input of another delay block not shown. The last two delay blocks of the signal delay circuit are 306 and 308. The number of delay blocks used is determined by the delay time needed.

During design of an SRAM, the signal development time is determined using models that estimate how much time is needed for a signal to develop on bit lines and have a sense amp accurately amplify the signal. However, because circuits do not always function as predicted by models, testing is needed to ensure that the time allowed is sufficient to correctly amplify the signal.

Figure 4:
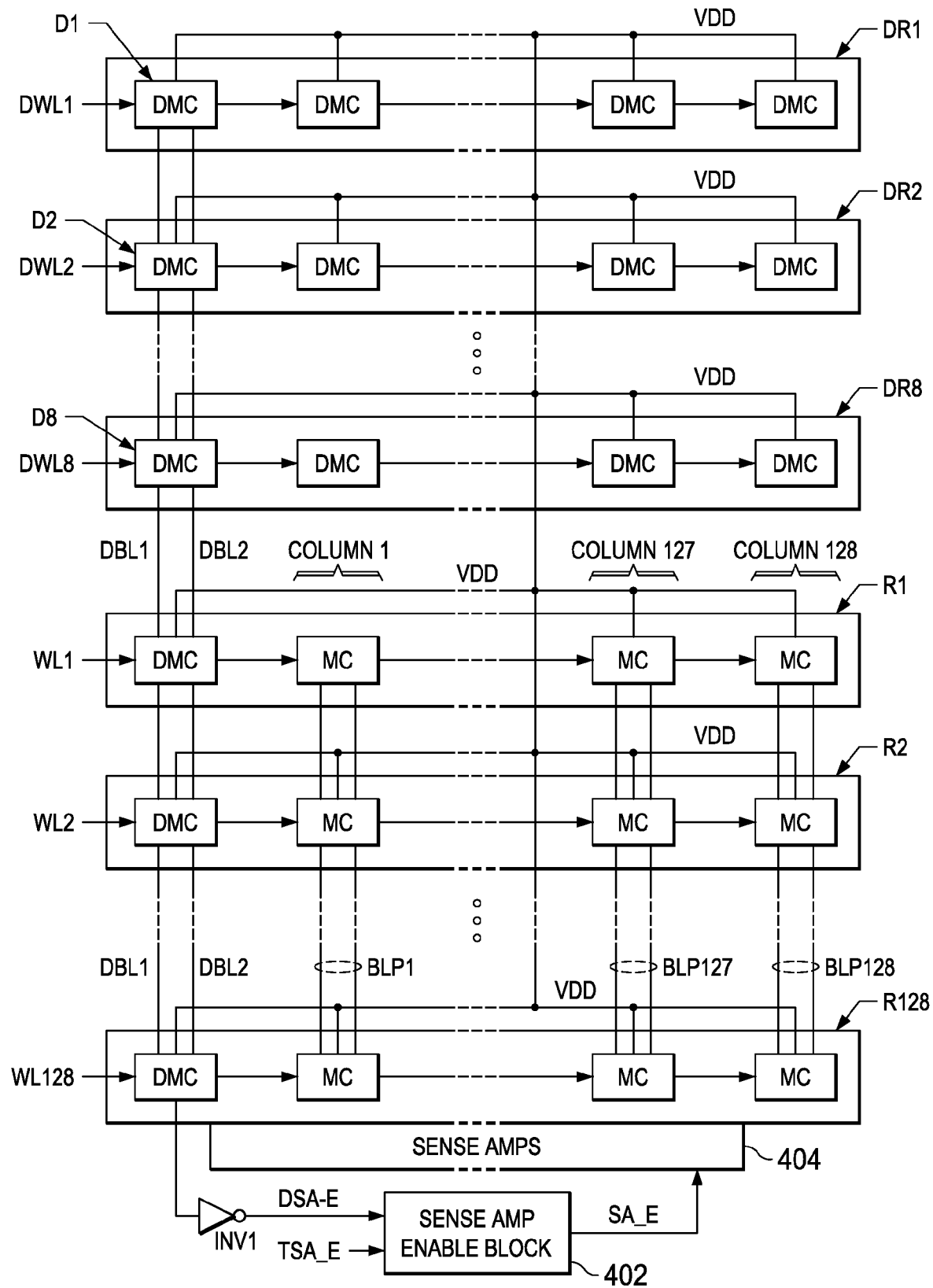
FIG. 4 is block diagram of a circuit that is used to determine the signal develop time of a memory cell. (Prior Art)

After SRAMs have been fabricated and before they are shipped to a customer, SRAMs are tested to insure that they function properly. To insure that an SRAM is functioning properly and to provide additional margin, the SRAM is tested with signal development time that is less than what the customer will use. This will ensure that SRAM bits that do not have sufficient margin with respect to customer use case will be identified during testing. FIG. 4 is block diagram of a circuit that is used to vary the signal develop time of a memory cell.

FIG. 4 includes 8 dummy rows DR1-DR8. Each of these rows includes 128 dummy memory cells, DCM. The dummy memory cells are identical to a normal SRAM memory cell except these memory cells store data to test the signal develop time of an SRAM memory cell. These dummy memory cells are also used to create loads for dummy word lines DWL1-DWL8 and to drive dummy bit lines DBL1 and DBL2. In this example, dummy bit line DBL1 is connected to an inverter INV1 that drives a sense amp enable block 402. In other embodiments of the invention either a non-inverting buffer or an inverting buffer may be used depending on the logical value on DBL1. The sense amp enable block 402 determines which signal is used to enable a selected sense amp.

FIG. 4 also includes 128 rows R1-R128. Each of these rows includes 1 dummy memory cell DCM and 128 memory cells. Word lines WL1-WL128 are electrically connected to the memory cells in their respectively rows R1-R128. However, the word lines are not directly electrically connected to the dummy memory cell DMC in their respective rows R1-R128. The single dummy memory cell is used to create loads for dummy bit lines DBL1-DBL2. The memory cells MC in rows R1 -128 retain actual data. In this example, bit lines pairs BLP1-BLP128 are electrically connected to memory cells MC and sense amps SA in their respective columns C1-C128.

During normal operation (i.e. not being tested), any combination of dummy word lines DWL1-DWL8 may be driven to high logical value and one word line, for example WL3, from word lines WL1-WL128 is selected by driving the word line WL3 to a logical high value. When WL3 is driven to a logical high value, memory cells MC contained in R3 are activated (dummy memory cell MC however is not activated) and bit line pairs BP1-BP128 are actively driven by the memory cell in its respective column C1-C128. In this example, a bit decoder (not shown) determines how many bits are sensed by sense amp SA in their columns C1-C128 and then driven to other circuit in the SRAM. During normal operation, the dummy sense enable signal DSA_E may be used to control the time that a signal is developed on the bit lines of a memory cell or a timed sense amp enable TSA_E that uses a signal delay circuit 300 (see FIG. 3) may be used to control the time that a signal is developed on the bit lines of a memory cell. The sense amp enable block 402 determines whether sense enable signal DSA_E or TSA_E is used during normal operation.

During normal operation, the time allowed for signal development can be varied by selecting one or more of the eight dummy memory cells D1-D8 electrically connected to the dummy bit lines DBL1 and DBL2. For example, when only a relatively slow access time is required, only one or two dummy memory cells are selected from the eight dummy memory cells D1-D8 by selecting two dummy word lines concurrently from the eight dummy word lines DL1-DWL8. However, when a relatively faster access time is required, six or more dummy memory cells may be selected from the eight dummy memory cells D1-D8 by selecting six dummy word lines concurrently from the eight dummy word lines DL1-DWL8. The signal delay circuit 300 may also be used during normal operation but the signal development in this case is fixed by the signal delay circuit 300.

During operation of a signal development test, one or more dummy word lines DWL1-DWL8 are driven to a logical high level and one word line, for example WL3, from word lines WL1-WL128 is selected by driving the word line WL3 to a logical high value. The number of dummy word lines selected depends on how fast dummy bit lines DBL1 and DBL2 need to be driven. For example, only one dummy word line is driven when the dummy bit lines need to be driven relatively slowly. However, when dummy bit lines DBL1 and DBL2 need to be driven relatively fast, six or more dummy word lines are activated at the same time for example. In this embodiment of the invention, the most extreme screening of the access time of a memory cell in the SRAM takes place when all eight of the dummy memory cells D1 -D8 are activated concurrently. All eight of the dummy memory cells D1-D8 are activated concurrently when all eight dummy word lines are driven to a logical high value concurrently.

As previously discussed, the dummy rows DR1-DR8 and the dummy bit lines DBL1 and DBL2 are added to test the signal development time of memory cells MC in an SRAM and to vary the time allowed for signal development during normal operation of the SRAM. None of the dummy memory cells DMC store actual data. Each dummy row DR1-DR8 has 128 dummy memory cells in order to create a load that is very similar to the load seen by a word line in one of the rows R1-R128. Only one dummy cell (i.e. D1-D8) in each dummy row DR1-DR8 drives the dummy bit lines DBL1 and BDBL2. More than one dummy row is used in order to be able to drive the dummy bit lines DBL1 and DBL2 faster.

The dummy memory cells D1-D8 are used to control the length of time for signal development. It is important that dummy memory cells D1-D8 be able to be written concurrently with the same binary logical value. In the case where dummy memory cells D1-D8 "wake up" with all logical one's stored when the SRAM is powering up, it can be difficult to write logical zero's to the dummy memory cells D1 -D8 due to resistive voltage drops along the dummy bit line DBL1. Because all of the dummy memory cells D1-D8, in this example, started out with logical ones stored, the amount of current being drawn along bit line DBL1 can cause the voltage along bit line DBL1 to rise above an ideal voltage of zero volts. When the voltage on bit line DBL1 rises too far above zero volts, one or more of the dummy memory cells D1-D8 may fail to have a logical zero written to it. When this occurs, signal development time will not be correct.

Figure 5:
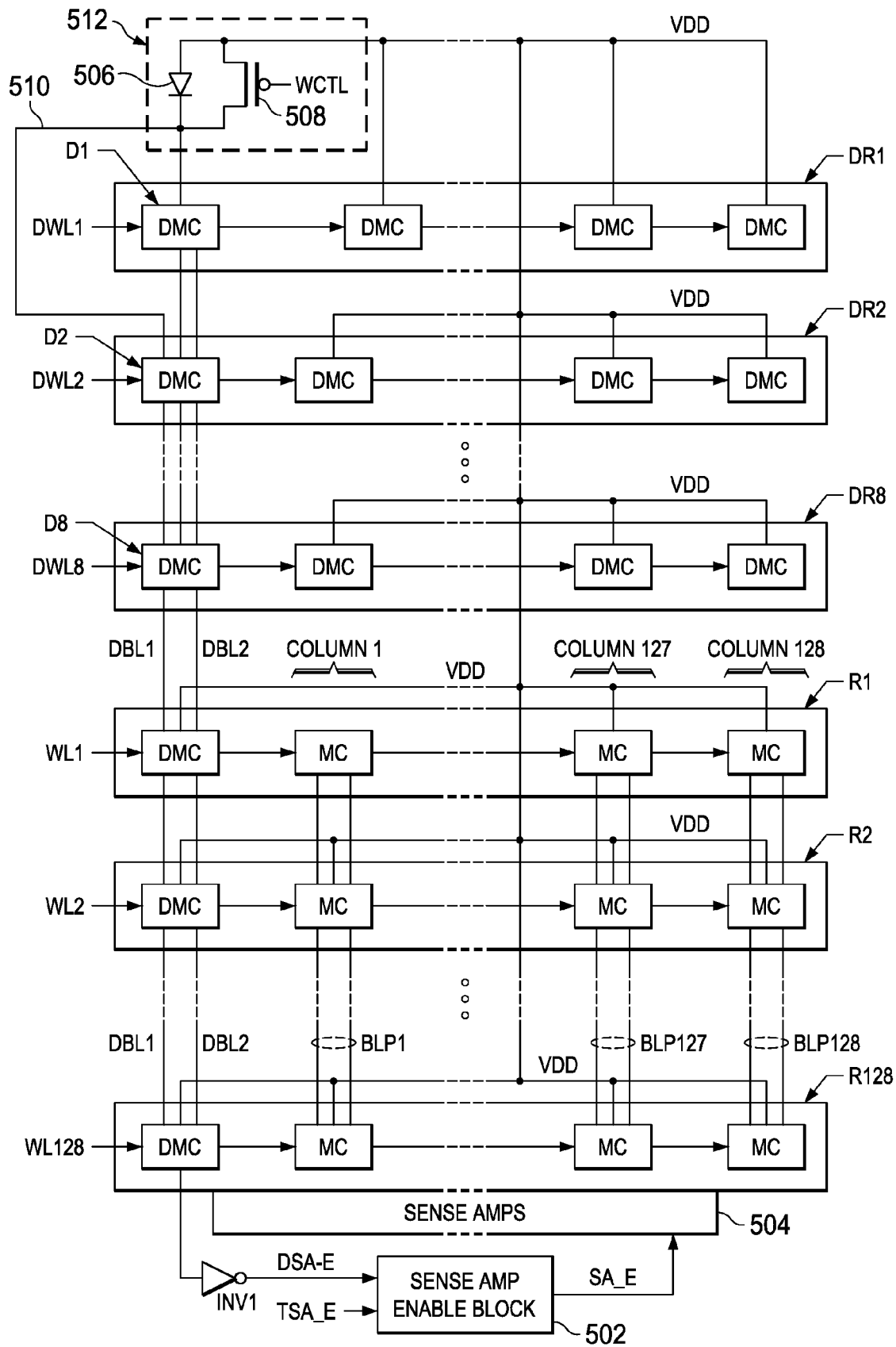
FIG. 5 is block diagram of a circuit used to write binary logical values to dummy memory cells according to an embodiment of the invention.

In an embodiment of the invention, a switch 512 containing a diode 506 and a PFET (p-type field-effect transistor) 508 is added between the power supply VDD and the power supply line 510 of the dummy memory cells D1-D8 in order to improve the probability that logical zeros can be written to all eight dummy memory cells D1-D8 when all eight dummy memory cells D1-D8 "wake up" as logical ones (see FIG. 5).

When the diode 506 is activated (i.e. when WLTL is a high logical value) during a write, the voltage on the power supply line 510 is reduced by a threshold voltage $V_T$ and approximately equal to VDD–$V_T$. Because the voltage on the power supply line 510 is reduced by a threshold voltage $V_T$, the rise on the dummy bit line DBL1 is reduced because the amount of current drawn through dummy bit line DBL1 is smaller. As result, all eight dummy memory cells D1-D8 may be written concurrently and within a single clock cycle.

When the dummy memory cells D1-D8 are not being written to, control signal WCTL is driven to a logical low value. When the control signal WCTL is driven to a logical low value, the PFET 508 is turned on and the voltage on the power supply line 510 is approximately equal to VDD.

Figure 6A:
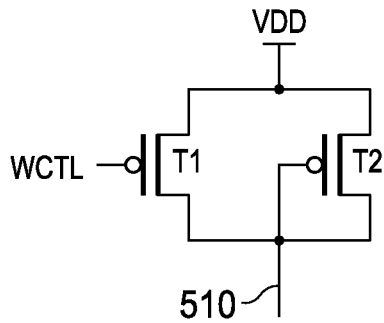
FIG. 6A is circuit diagram of switch according to an embodiment of the invention.
Figure 6B:
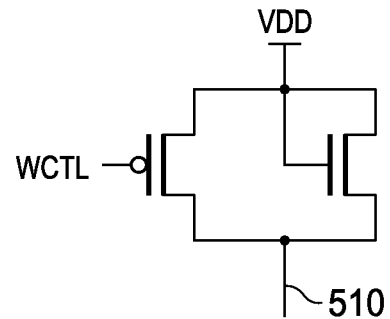
FIG. 6B is circuit diagram of switch according to an embodiment of the invention.

Other embodiments of switch 512 are shown in FIGS. 6A and 6B. FIG. 6A is an example of a switch 512. In this example, a PMOS transistor T1 is connected in parallel with PMOS transistor T2 (configured as a diode) between VDD and the power supply line 510. The source of the transistor T1 and the anode of the transistor T2 are electrically connected to VDD. The drain of the transistor T1 and the cathode of transistor T2 are electrically connected to the supply line 510. The gate of the transistor T1 is electrically connected to the control signal WCTL.

FIG. 6B shows an example of a switch 512. In this embodiment, a PMOS transistor T1 is connected in parallel with NMOS (n-type metal-oxide semiconductor) transistor T3 (configured as a diode) between VDD and the power supply line 510. The source of the transistor T1 and the anode of the transistor T3 are electrically connected to VDD. The drain of the transistor T1 and the cathode of transistor T3 are electrically connected to the power supply line 510. The gate of the transistor T1 is electrically connected to the control signal WCTL.

Figure 7:
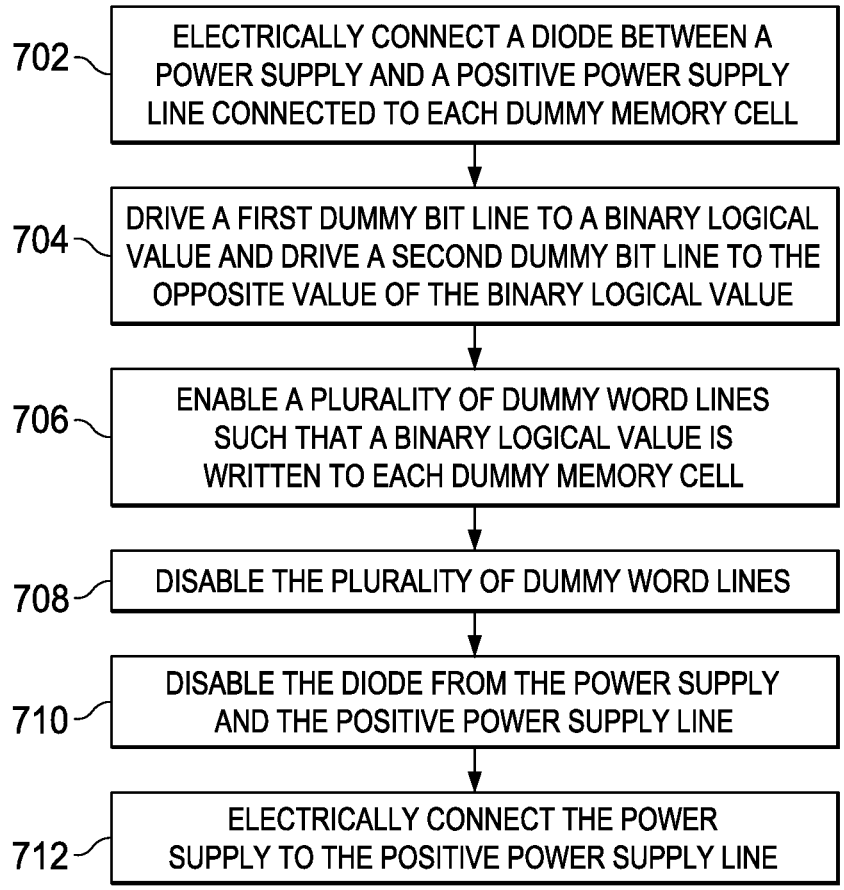
FIG. 7 is a flow chart illustrating a method used to write binary logical values to dummy memory cells according to an embodiment of the invention.

FIG. 7 is a flow chart illustrating a method used to write binary logical values to dummy memory cells according to an embodiment of the invention. During step 702 a diode 506 is electrically connected between a power supply VDD and a positive power supply line 510. The positive power supply line 510 is electrically connected to each dummy memory cell D1-D8. At step 704, the first dummy bit line DBL1 is driven to a binary logical value and the second dummy bit line DBL2 is driven to the opposite value of the binary logical value. During step 706, one or more dummy word lines from dummy word lines DWL1-DWL8 are driven to a logical high value concurrently. After the binary logical value has been written to the dummy memory cells selected from dummy memory cells D1-D8, the selected dummy word lines are disabled by driving them to a logical low level as shown in step 708. During step 710, the diode 506 is disabled by turning on PFET 508. Turning on PFET 508 also electrically connects the power supply to the positive power supply line as shown in step 712.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method of writing a binary logical value to a plurality of dummy memory cells concurrently (SRAM) comprising:
   electrically connecting a diode between a power supply and a positive power supply line electrically connected to each dummy memory cell in the plurality of dummy memory cells; wherein the plurality of dummy memory cells are electrically connected to first and second dummy bit lines;
   wherein the plurality of dummy memory cells are identical to an SRAM memory cell except the plurality of dummy memory cells are used only to test a signal develop time of an SRAM memory cell;
   wherein data stored in the plurality of dummy memory cells is used only to test the signal develop time of an SRAM memory cell;
   driving the first dummy bit line to a first voltage that represents the binary logical value;
   driving the second dummy bit line to a second voltage that represents the opposite value of the binary logical value;
   enabling a plurality of dummy word lines wherein the binary logical value is written to each dummy memory cell in the plurality of dummy memory cells;
   disabling the plurality of dummy word lines;
   electrically disconnecting the diode from the power supply and the positive power supply line;
   electrically connecting the power supply to the positive power supply line.

2. The method of claim 1 wherein enabling the plurality of dummy word lines comprises driving each dummy word line in the plurality of word lines to a logical high value.

3. The method of claim 1 wherein disabling the plurality of dummy word lines comprises driving each dummy word line in the plurality of word lines to a logical low value.

4. The method of claim 1 wherein electrically connecting the power supply to the positive power supply line comprises turning on a transistor electrically connected between the power supply and the positive power supply line.

5. The method of claim 4 wherein the transistor is a PFET (p-type field-effect transistor) having a source, drain and gate; wherein the source is electrically connected to the power supply, the drain is electrically connected to the positive power supply line and the gate is connected to a control signal, the control signal being driven to a logical low value.

6. The method of claim 1 wherein electrically connecting a diode between a power supply and a positive power supply line comprises turning off a transistor electrically connected between the power supply and the positive power supply line.

7. The method of claim 4 wherein the transistor is a PFET (p-type field-effect transistor) having a source, drain and gate; wherein the source is electrically connected to the power supply, the drain is electrically connected to the positive power supply line and the gate is connected to a control signal, the control signal being driven to a logical high value.

8. The electronic device of claim 1 where the diode is selected from a group of solid-state devices consisting of a solid-state diode, an NMOS (n-type metal-oxide semiconductor) transistor configured as a diode and a PMOS (p-type metal-oxide semiconductor) transistor configured as a diode.

9. An electronic device comprising:
   a diode having a cathode and an anode wherein the anode is electrically connected to a power supply and the cathode is electrically connected to a positive power supply line;
   a transistor having a gate, drain and source wherein the source is electrically connected to the power supply, the drain is electrically connected to the positive power supply line and the gate is connected to a control signal;

wherein the positive supply line is electrically connected to a plurality of dummy memory cells, the plurality of dummy memory cells being electrically connected to a first dummy bit line and a second dummy bit line;

wherein each dummy memory cell has a separate and distinct dummy word line electrically connected to it;

wherein when the plurality of dummy memory cells is written to, the control signal turns the transistor off;

wherein when the plurality of dummy memory cells is not written to, the control signal turns the transistor on; and wherein the plurality of dummy memory cells are identical to an SRAM memory cell except the plurality of dummy memory cells are only used to test a signal develop time of an SRAM memory cell;

wherein data stored in the plurality of dummy memory cells is used only to test the signal develop time of an SRAM memory cell.

10. The electronic device of claim 9 wherein the transistor is a PFET (p-type field effect transistor) wherein the PFET is turned on when the control signal is a logical low value and the PFET is turned off when the control signal is a logical high value.

11. The electronic device of claim 9 wherein writing to the plurality of dummy cells comprises:

driving the first dummy bit line to a voltage representing a first binary logical value;

driving the second dummy bit line to a voltage representing the opposite value of the first binary logical value;

driving the separate and distinct dummy word lines to a logical high value.

12. The electronic device of claim 9 where the diode is selected from a group of solid-state devices consisting of a solid-state diode, an NMOS (n-type metal-oxide semiconductor) transistor configured as a diode and a PMOS (p-type metal-oxide semiconductor) transistor configured as a diode.

13. The electronic device of claim 9 wherein the plurality of dummy word cells are written to concurrently.

14. The electronic device of claim 9 wherein the plurality of dummy word cells are written to during a single clock cycle.

15. The electronic device of claim 9 wherein the electronic device is integrated with a SRAM (static random access memory).

16. The electronic device of claim 15 wherein the SRAM is integrated with a system on a chip.

* * * * *